United States Patent
Lin et al.

(10) Patent No.: US 6,770,903 B2
(45) Date of Patent: Aug. 3, 2004

(54) METAL-OXIDE-SILICON DEVICE INCLUDING NANOMETER SCALED OXIDE STRUCTURE TO ENHANCE LIGHT-EMITTING EFFICIENCY

(75) Inventors: Ching-Fuh Lin, Taipei (TW); Wei-Fang Lin, Taipei (TW); Eih-Zhe Liang, Taipei (TW); Ting-Wei Su, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 10/251,890

(22) Filed: Sep. 23, 2002

(65) Prior Publication Data

US 2003/0201434 A1 Oct. 30, 2003

(30) Foreign Application Priority Data

Apr. 26, 2002 (TW) ...................................... 91108643 A

(51) Int. Cl.[7] ............................................. H01L 29/06
(52) U.S. Cl. ...................... 257/30; 257/206; 257/211; 257/345; 257/762; 257/797; 438/396
(58) Field of Search ............................... 257/206, 211, 257/345, 762, 797; 438/396

(56) References Cited

U.S. PATENT DOCUMENTS 6,475,874 B2 * 11/2002 Xiang et al. ................ 438/396

FOREIGN PATENT DOCUMENTS

EP    0 544 408 A2    10/1992
JP    2000-164921    6/2000

OTHER PUBLICATIONS

P.D. Altukhov, E.G. Kuzminov, "Condensation of a hot electron–hole plasma in tunneling silicon MOS Structures", Solid State Communications, v. 111, No. 7, p.p. 379–384, Jul. 14, 1999.*

P.D.Altukhov, E.G. Kuzminov, "The self–compression of injected electron–hole plasma in silicon", Physica Status Solidi (d), v.232, No. 2, p.p. 364–379, Aug. 2002.*

(List continued on next page.)

Primary Examiner—David Nelms
Assistant Examiner—Mai-Huong Tran
(74) Attorney, Agent, or Firm—Rosenberg, Klein & Lee

(57) ABSTRACT

A metal-oxide-silicon (MOS) device that at least includes a silicon-based substrate, a nanometer scaled oxide layer formed on the silicon-based substrate and a metal layer formed on the oxide layer, is disclosed. The present invention basically uses a nanometer scaled oxide structure that result in a non-uniform tunneling current to enhance light-emitting efficiency. The manufacturing steps of the MOS device according to the present invention are quite similar to those of conventional MOS device, so the MOS device according to the present invention can be integrated with the current silicon-based integrated circuit chip. Further the application fields of the silicon-based chip and material can be extended. The cost of MOS device can be reduced and its practicality can be increased.

21 Claims, 6 Drawing Sheets

OTHER PUBLICATIONS

P.D.Altukhov, "Effective Room–Temperature Silicon Light Emitters in Optoelectronics", Abstracts of the International Symposium "Nano and Giga Challenges in Microelectronics", Moscow, Russia, Sep. 10–13, 2002, p.p. 82–83.*

I.V.Grekhov and E.V.Ostroumova, "Injection capacity of an MOS emitter with a tunneling–thin oxide layer at high current densities", Pls'ma Zh. Tekh. Fiz., v. 12, p.p. 1209–1212, Oct. 12, 1986. [Sov. Tech. Phys. Lett. 12(10), Oct. 1986, 501–502].*

P.D. Altukhov, A.G. Bulgakov, G.V. Ivanov, E.G.Kuzminov, "Bistable electroluminescence of tunneling silicon MOS structures", Solid State Communications, v. 103, No. 2, p.p. 103–106, Jul. 1997.*

P.D. Altukhov, G.V.Ivanov, E.G.Kuzminov, "A selforganized double potential barrier in tunneling light emitting silicon MOS structures", Solid–State Electronics, v. 42, No. 9, pp. 1657–1660, Sep. 1998.*

Ching–Fuh Lin et al, "SiO2 –Nanoparticles Enhancing SI Band–Edge Electroluminescence to Nearly Lasing Actions," IEEE– Nano, Oct. 29, 2001.

C.W. Liu et al., "Roughness–Enhanced Electroluminescence from Metal Oxide Silicon Tunneling Diodes," IEEE Electron Devices Letters, vol. 21, No. 12, Dec. 2000.

Ching–Fuh Lin, et al.; $SiO_2$–Nanoparticles Enhancing Si Band–Edge Electroluminescence to Nearly Lasing Actions; National Taiwan University; Taiwan, R.O.C.

* cited by examiner

METAL-OXIDE-SILICON DEVICE INCLUDING NANOMETER SCALED OXIDE STRUCTURE TO ENHANCE LIGHT-EMITTING EFFICIENCY

FIELD OF THE INVENTION

The present invention relates generally to a metal-oxide-silicon device including a nanometer scaled oxide structure to enhance light-emitting efficiency, and in particular to a metal-oxide-silicon device that can emit light by way of electron excitation, and enhance light-emitting efficiency by way of a nanometer scaled oxide structure.

BACKGROUND OF THE INVENTION

In accordance with the prior art, metal-oxide-silicon (abbreviated as "MOS") device was given out by Moll, Pfann and Garrett at 1959. However, the known MOS device has not been put to use in the application of electroluminescent element. MOS device was originally developed for the purpose of voltage-controlled capacitor. In 1970s, Boyle and Smith first put through a new concept of charge-coupling and made charge-coupled device (CCD) accordingly, which has become a crucial component in a digital camera. In 1980s, MOS device has been widely used as a key element in integrated circuits (ICs). CMOS (complementary metal-oxide-semiconductor) transistor that is made up of an n-channel MOSFET (metal-oxide-semiconductor field-effect transistor) together with a p-channel MOSFET plays a significant role in a very-large scaled integrated (VLSI) circuit or an ultra-large scaled integrated (ULSI) circuit. Even in the case of a solar cell, MOS device is still treated as a high-valued component. Although MOS device plays an extremely important role in microelectronic circuits, its application in light-emitting device is not highly expected because of the indirect bandgap of silicon.

Even so, the applicant has disclosed a MOS light-emitting diode in Taiwanese Patent Publication No. 456057 filed on Jun. 17, 1999, wherein the MOS device is capable of emitting light by way of electron excitation and turns into a light-emitting diode. The disclosed MOS light-emitting diode in this example is also known as "MOSLED".

The applicant therefore contributes heaps of efforts to improve the light-emitting efficiency of conventional MOS-LED device, and finally developed a MOS device including a nanometer scaled oxide structure to result in a non-uniform current to enhance light-emitting efficiency.

SUMMARY OF THE INVENTION

An object of the present invention is the provision of a MOS device including a nanometer scaled oxide structure to enhance light-emitting efficiency, which basically uses the nanometer scaled oxide layer to result in a non-uniform tunneling current to enhance light-emitting efficiency.

Another object of the present invention is the provision of a MOS device including a nanometer scaled oxide structure to enhance light-emitting efficiency, wherein its manufacturing steps are quite similar to those of conventional MOS device, so that it can be integrated with current silicon-based chip. It may further extend the application fields of silicon-based chip and material.

Another further object of the present invention is the provision of a MOS device including a nanometer scaled oxide structure to enhance light-emitting efficiency, wherein its structure and manufacturing steps are quite simple and its cost is inexpensive.

The other objects, features and advantages of the present invention will become more apparent through the following descriptions with reference to the accompanying drawings, in which:

DETAILED DESCRIPTION OF THE PREFERRED EMBODIMENT

Figure 1:
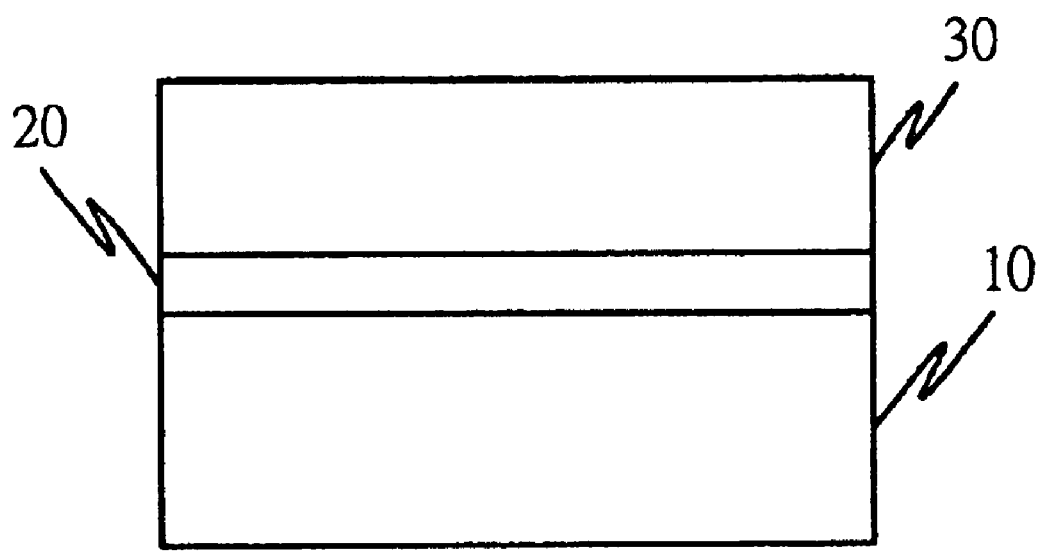
FIG. 1 shows a cross-sectional view of the MOS structure according to a preferred embodiment of the present invention.

The present invention has been disclosed in public in IEEE conference during Oct. 28, 2001 to Oct. 30, 2001, wherein the related dissertation is also incorporated herein for reference. The conception of the present invention is to remove the limitations on the application of MOSLED due to the indirect bandgap of silicon, so as to enhance the light-emitting efficiency of MOSLED.

The fundamentals of enhancing light emitting efficiency for MOSLED according to the present invention is achieved by way of tunneling phenomena in quantum mechanic. While the thickness of oxide layer is thin at the level of nanometer range, the probability of electron tunneling within MOSLED will increase greatly. The probability of electron tunneling will rapidly increase with the forward bias voltage. However, the oxide layer is not a conductor, and a round bias voltage will be applied across the oxide layer. That is, different bias voltages are applied across the metal layer and silicon substrate, which cause the energy bandgap of silicon to bend. In the case of N-type silicon substrate, the energy band of silicon in the proximity of the silicon-oxide interface will bend down under forward-biased condition. A potential well for electron will be generated and a large number of electrons will be accumulated here. In the mean time, a large number of holes will reach the potential well by way of tunneling effect. Therefore, a large number of electrons and holes can be recombined here to generate photons. In the case of P-type silicon substrate, the fundamentals of generating photons by way of electron excitation can be deduced in a similar way.

If silicon dioxide nano-particles are deposited between the silicon substrate and metal layer, an oxide layer with a non-uniform thickness can be obtained. On the condition that a bias voltage is applied to the metal layer and silicon substrate, the potential well as mentioned above will not only be limited to be perpendicular to the silicon-silicon dioxide interface, but also be limited to be parallel to the silicon-silicon dioxide interface. Thus a three-dimensional potential well be formed, which results in a local accumulation of electrons and holes. In this manner, the light-emitting efficiency will be enhanced greatly.

In accordance with quantum mechanics and semiconductor device physics, it is known that the oxide layer with a thickness at the level of nanometer has the following characteristics:

1. The electrons are allowed to pass through the oxide later by way of tunneling effect, while the probability of electron tunneling will increase rapidly with the increase of applied voltage.

2. The probability of electron tunneling will decrease with the increase of the thickness of oxide layer.

The foregoing concept is part of physical mechanism that is known to those familiar with MOS techniques in the field of semiconductor. In addition, the energy band of silicon in the proximity of silicon-oxide interface will bend to generate a potential well for electron or hole. Consequently, a large number of electrons or holes will be accumulated here. The probability of recombination of electrons and holes and generation of photons will greatly increase. Due to the periodic termination of silicon in the proximity of its interface, the requirements of conserving momentum are reduced, and the probability of radiative recombination will greatly increase.

In order to further illustrate the structure and the effect of MOSLED in accordance with the present invention, it is intended to give a preferred embodiment as well as detailed descriptions in the following.

For the purpose of avoiding confusion caused by taking P-type semiconductor and N-type semiconductor simultaneously as examples for illustration, in this preferred embodiment it is desired to use N-type semiconductor as a way for illustration only. Referring to FIG. 1, which shows a cross-sectional view of the MOS structure according to a preferred embodiment of the present invention. As shown, the MOS structure including a nanometer scaled oxide structure of the present invention at least includes a silicon-based chip 10, a nanometer scaled oxide layer 20 formed on the silicon-based chip 10, and a metal layer 30 formed on the oxide layer 20.

It is to be noted that the nanometer scaled oxide layer 20 can result in a non-uniform tunneling current and cause the energy band of silicon-based chip 10 to bend non-uniformly. In the presence of bias voltage, the nanometer scaled oxide layer 20 may be formed by an insulating material, such as nitride, but the electrons still can pass through the oxide layer 20 by way of tunneling effect. The nanometer scaled oxide layer 20 may be formed by oxide, nitride or other insulating materials that allows electrons to pass therethrough by way of tunneling effect. The nanometer scaled oxide layer 20 has a dimension ranged between 1 nm to 100 nm, and may be formed by silicon dioxide nano-particles.

The formation of the nanometer scaled oxide layer 20 may be carried out by one of the method listed in the following: non-uniform surface oxidization process, chemical etching, dry etching, photon bombardment, ion bombardment, electron beam development, ion beam development, X-ray development, optical proximity development, atomic or penetrative probing that results in non-uniform oxidization. The silicon-based chip 10 may be one of a P-type, N-type or undoped semiconductor.

The metal layer 30 may be formed by silver, silver paint, aluminum or Indium-Tin-Oxide (ITO) or other conducting materials, and the silicon-based chip 10 may be replaced by other materials having an indirect bandgap, such as germanium or silicon carbide (SiC).

Figure 2A:
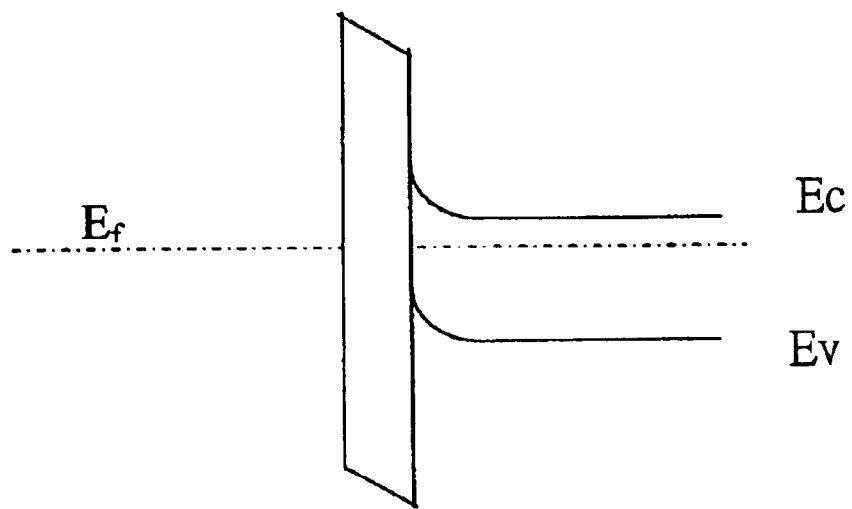
FIGS. 2A and 2B show the energy band of silicon of a N-type MOSLED in the absence of bias voltage according to a preferred embodiment of the present invention.
Figure 2B:
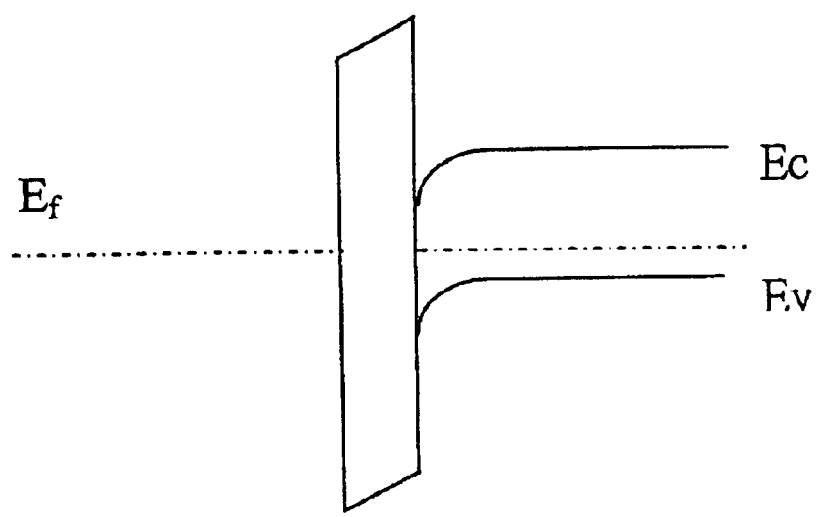

FIGS. 2A and 2B show the energy band of silicon in the absence of bias voltage. Under thermal equilibrium, the energy band is curved, while no current is flowing therethrough and no light is emitted. When the metal layer is applied with a positive voltage, the current is still infinitesimal. On the other hand, because the energy band remains to bend up and no electron is accumulated in the proximity of silicon-oxide interface, there will not be a considerable amount of recombination of electrons and holes to be occurred.

Figure 3A:
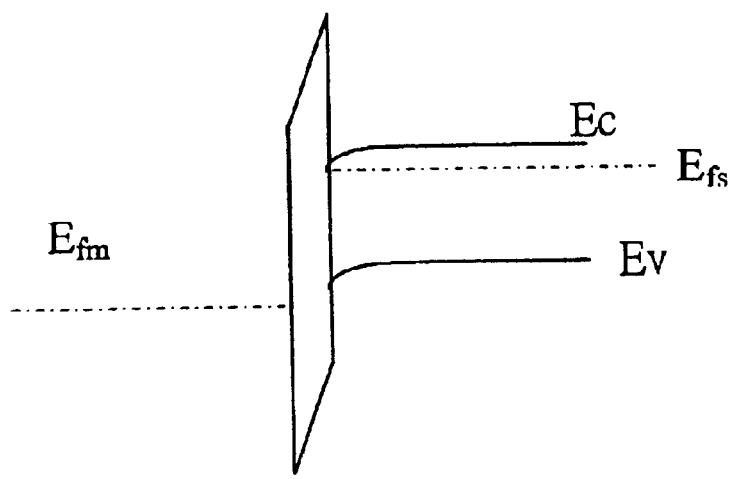
FIGS. 3A and 3B show the energy band of silicon of a one-dimensional N-type MOSLED and a one-dimensional P-type MOSLED in which the metal layers are respectively applied with forward bias voltage and reverse bias voltage according to a preferred embodiment of the present invention.
Figure 3B:
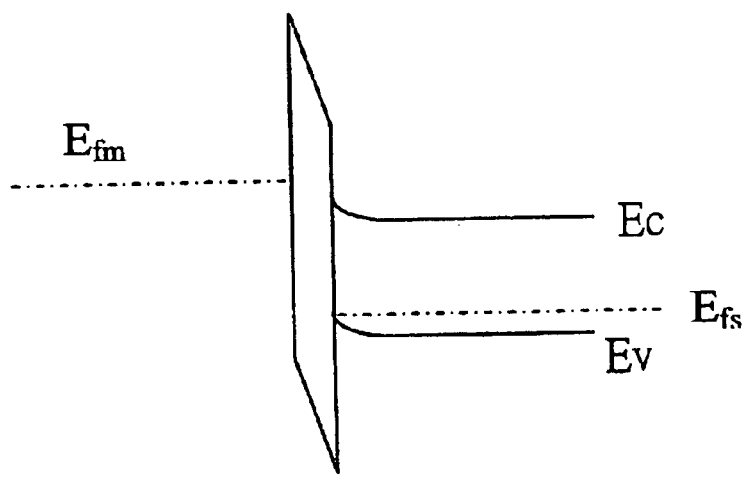
Figure 4:
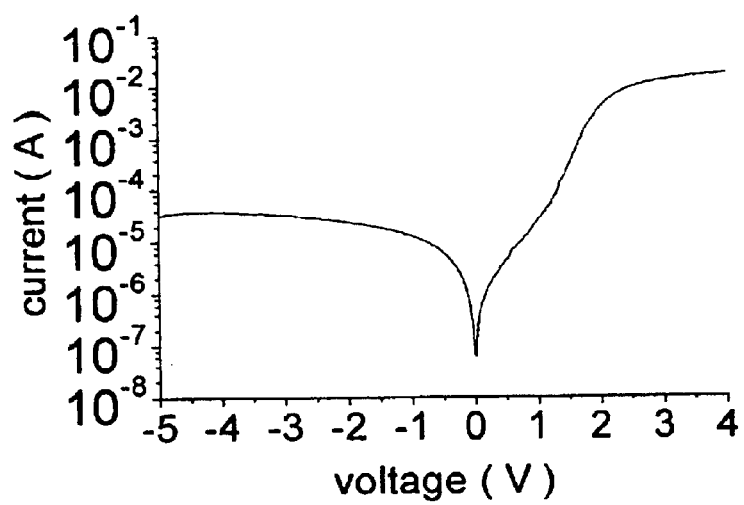
FIG. 4 shows a compilation of current I-V curves under forward bias according to a preferred embodiment of the present invention.

While the voltage applied to the metal layer continuously increases up to a level that even up the energy band, the energy barrier that the tunneling carriers have to overcome is reduced, and thereby the tunneling current increases. While the positive applied voltage continuously increases, the energy band turns to bend down. It can be known from the WKB method of quantum mechanics that the probability of tunneling is greatly increased, as shown in FIGS. 3A and 3B. Therefore, the current flowing therethrough increases rapidly (also referred to as tunneling current). Referring to FIG. 4 which shows a compilation of I–V curves under forward bias condition according to a preferred embodiment of the present invention. It reveals that the tunneling current will increase rapidly under flat band voltage.

While the energy band is bending down, the conduction band proximate to the silicon-oxide interface forms a potential well for electrons, and a large number of electrons are accumulated here. In the mean time, a large number of electrons pass through the metal layer and reach the silicon-oxide interface, and thus a large number of recombinations of electrons and holes will take place in this area. However, because silicon is a material having an indirect bandgap, the momentum of electron is not equal to that of hole. In recombination, the conservation law of momentum can not be established. Accordingly, phonons have to join in the recombination process so as to meet the requirements of momentum conservation. As a result, the probability of recombination of electrons and holes is insignificant under normal condition.

Figure 5:
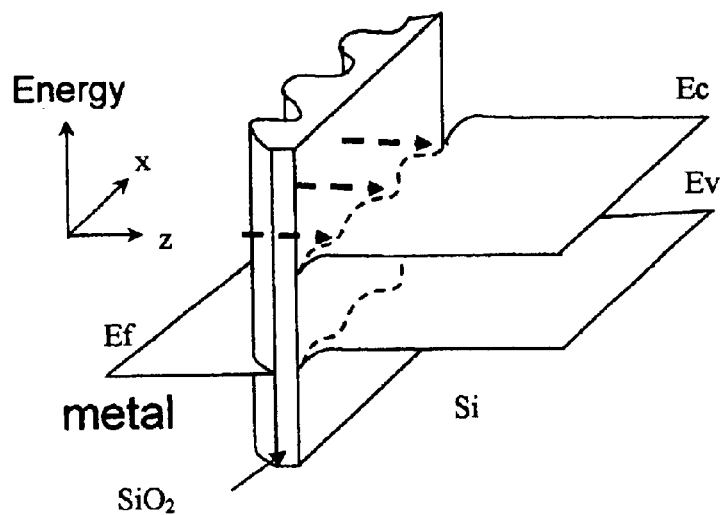
FIG. 5 shows the two-dimensional energy band of a N-type MOSLED in which the metal layer is applied with forward bias voltage according to a preferred embodiment of the present invention.

However, the use of silicon dioxide nano-particles between the silicon substrate and the metal layer can result in an oxide layer with a non-uniform thickness, and can bring about the following effects:

1. Under forward bias condition, the voltage across a thin oxide layer is identical to that across a thick oxide layer. That is, the voltage gradient of a thin oxide layer is larger than that of a thick oxide layer. Therefore, the level of bending of the energy band where the silicon substrate contacts with the thin oxide layer is higher than the level of bending of the energy band where the silicon substrate contacts with the thick oxide layer. As shown in FIG. 5, a three-dimensional potential well is formed, wherein z-axis is perpendicular to the silicon-silicon-dioxide interface and x-axis is parallel to the silicon-silicon-dioxide interface. The energy band in the y-axis direction is similar to that in the x-axis direction, and the y-axis of the three-dimensional potential well is not explicitly shown. The three-dimensional potential well corresponds to the location where the silicon substrate contacts with thin oxide layer, and electrons will accumulate in the vicinity.

2. As stated above, the probability of tunneling will increase with the decrease of the thickness of the oxide layer. Therefore, the probability of tunneling for a thin oxide later is higher than that for a thick oxide layer, and a large number of tunneling holes will accumulate within the thin oxide layer.

The above-described effects will cause the electrons and holes to be locally accumulated in the same area. Because the dimension of nano-particles is within 100 nm, the electrons and holes will be limited in an area of nanometer range.

Because silicon is a material having an indirect bandgap, the recombination of electrons and holes can meet with the requirements of momentum conservation only when phonons take a part in the recombination process. Under normal conditions, there is little probability for the electrons, holes and phonons to get together, and thus the probability of recombination of electrons and holes and probability of emitting light are very insignificant. While the electrons and holes are limited within a area of nanometer range, they do not move freely. Thus the phonons are easily subject to be incorporated therein. That means that the original recombination that requires three kinds of particles (electrons, holes and phonons) to participate in has been changed into recombination that requires only two kinds of particles (electron-hole pairs and phonons) to participate in, and thereby the probability of recombination of electrons and holes are greatly increased and the light-emitting efficiency is enhanced.

Figure 6:
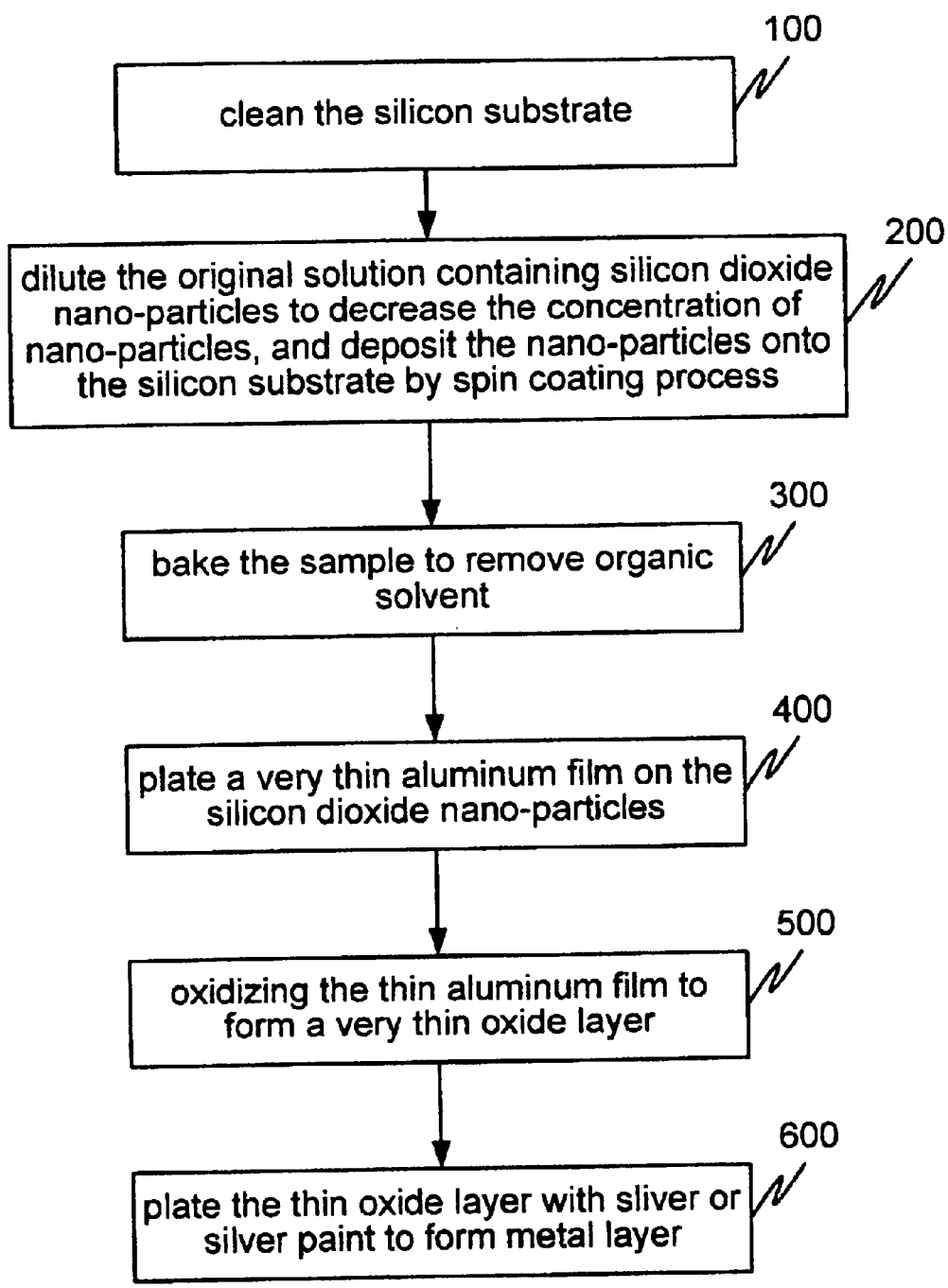
FIG. 6 illustrates the manufacturing steps of the MOS-LED according to a preferred embodiment of the present invention.

Referring to FIG. 6, which shows that the silicon dioxide nano-particles are deposited between silicon substrate and metal layer. The manufacturing process of the MOS device according to the present invention is explained as follows:

Step 100: clean the silicon substrate;
Step 200: dilute the original solution containing silicon dioxide nano-particles to decrease the concentration of nano-particles, and deposit the nano-particles onto the silicon substrate by spin coating process;
Step 300: bake the sample to remove organic solvent;
Step 400: plate a very thin aluminum film on the silicon dioxide nano-particles;
Step 500: oxidizing the thin aluminum film to form a very thin oxide layer; and
State 600: plate the thin oxide layer with sliver or silver paint to form metal layer.

The foregoing manufacturing steps are given as a way of example only, but are not intended to be taken as a limitation on the present invention. The present invention may be achieved as long as the thickness of the oxide layer is non-uniform and the dimension of the features within the oxide layer is at the level of nanometer.

Figure 7A:
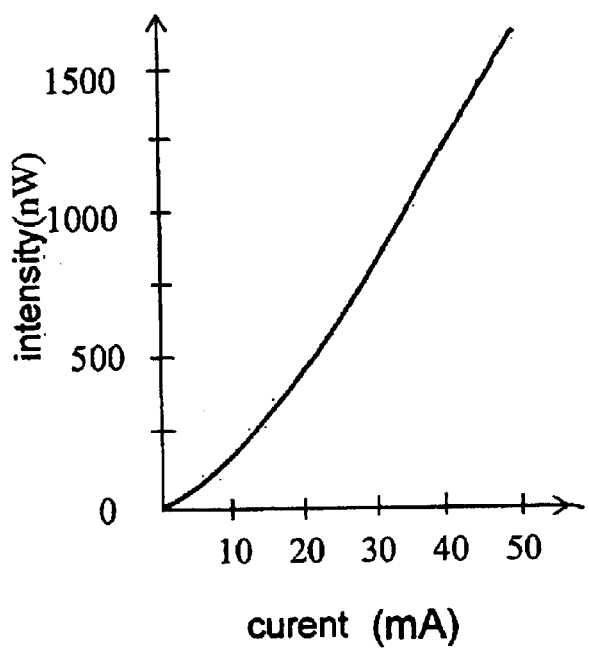
FIG. 7A is a compilation of light intensity-current curve according to a preferred embodiment of the present invention.
Figure 7B:
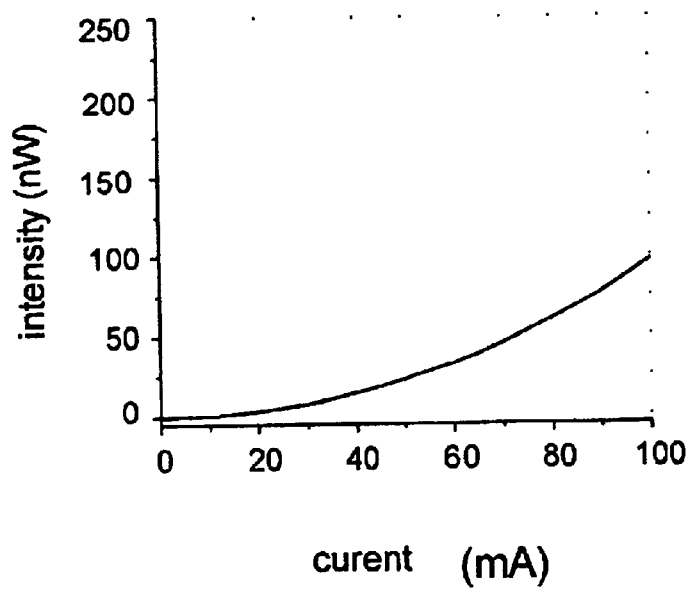
FIG. 7B is a compilation of light intensity-current curve that is plotted on the condition that the oxide layer does not contain nano-particles.

As shown in FIG. 7A, a compilation of light intensity-current curve according to a preferred embodiment of the present invention is illustrated. As shown in FIG. 7B, a compilation of light intensity-current curve that is plotted on the condition that the oxide layer does not contain nano-particles is illustrated. It is obvious that the light intensity of MOS device according to the present invention is enhanced by several hundred times. As shown in FIG. 7A, for injection current of 50 mA, the emitted light intensity can reach 1.5 uW and the corresponding external quantum efficiency is approaching $10^{-4}$. However, in FIG. 7A only the light that is emitted from the edge of silver paint is taken into count, while the other lights which are either screened out by the silver paint or emitted from other direction are not collected by photo detector. Therefore, if the total light is included, the actual external quantum efficiency could reach $10^{-3}$.

Because the manufacturing steps of the MOS device according to the present invention is quite similar to those of conventional MOS device, and the MOS device according to the present invention is fabricated with a silicon substrate, it can be integrated with the current silicon-based integrated circuit chip. This enables the silicon-based chip to be applicable to electronic product and to serve as a high-efficiency light-emitting element. Furthermore, the monolithic integration of electronic chip and light-emitting element can further extend the application field of the silicon-based chip and material. The structure and manufacturing steps of the MODLED device according to the present invention are quite simple and inexpensive, and more particularly, it can be directly combined with the IC manufacturing industry.

Although the invention has been described and illustrated in detail, it is to be clearly understood that the same is by the way of illustration and example only and is not to be taken by way of limitation, the spirit and scope of the present invention being limited only by the terms of the appended claims.

What is claimed is:

1. A metal-oxide-silicon light emitting device having enhanced light-emitting efficiency comprising:
   a silicon-based substrate;
   a nanometer scaled intermediate layer formed on said silicon-based substrate, said intermediate layer being nanometer scaled in thickness for promoting the tunneling of electrons therethrough responsive to a predetermined bias voltage thereacross, said intermediate layer including at least one of an oxide and a nitride material; and,
   a metal layer formed on said intermediate layer.

2. The metal-oxide-silicon light emitting device according to claim 1 wherein said nanometer scaled intermediate layer is non-uniform in thickness to provide a non-uniform tunneling current.

3. The metal-oxide-silicon light emitting device according to claim 1 wherein said nanometer scaled intermediate layer is configured to bend an energy band of said silicon-based chip non-uniformly in the presence of the bias voltage thereacross.

4. The metal-oxide-silicon light emitting device according to claim 1 wherein said nanometer scaled intermediate layer is formed by a nanometer scaled nitride material forming an insulating layer, which allows electrons to pass therethrough by a tunneling effect.

5. The metal-oxide-silicon light emitting device according to claim 1 wherein said nanometer scaled intermediate layer is an oxide material forming an insulating layer, which allows electrons to pass therethrough by a tunneling effect.

6. The metal-oxide-silicon light emitting device according to claim 1 wherein said nanometer scaled intermediate layer has a thickness dimension ranged between approximately 1 nm and 100 nm.

7. The metal-oxide-silicon light emitting device according to claim 4 wherein said nanometer scaled intermediate layer has a thickness dimension ranged between approximately 1 nm and 100 nm.

8. The metal-oxide-silicon light emitting device according to claim 5 wherein said nanometer scaled intermediate layer has a thickness dimension ranged between approximately 1 nm and 100 nm.

9. The metal-oxide-silicon light emitting device according to claim 1 wherein said nanometer scaled intermediate layer includes a plurality of silicon dioxide nano-particles.

10. The metal-oxide-silicon light emitting device according to claim 1 wherein said nanometer scaled intermediate layer is formed by a methods selected from the group consisting of: a non-uniform surface oxidization process, a chemical etching process, a dry etching process, a proton bombardment process, an ion bombardment process, an electron beam lithography process, an ion beam lithography process an X-ray lithography process, an near-field lithography process, and an atomic-force and scanning tunneling probing process that results in non-uniform oxidization.

11. The metal-oxide-silicon light emitting device according to claim 4 wherein said nanometer scaled intermediate layer is formed by a method selected from the group consisting of: a non-uniform surface oxidization process, a chemical etching process, a dry etching process, a proton bombardment process, an ion bombardment process, an electron beam lithography process, an ion beam lithography process an X-ray lithography process, a near-field lithography process, and an atomic-force and scanning tunneling probing process that results in non-uniform oxidization.

12. The metal-oxide-silicon light emitting device according to claim 5 wherein said nanometer scaled intermediate layer is formed by a method selected from the group consisting of: a non-uniform surface oxidization process, a chemical etching process, a dry etching process, a proton bombardment process, an ion bombardment process, an electron beam lithography process, an ion beam lithography process, an X-ray lithography process, an near-field lithography process, and an atomic-force and scanning tunneling probing process that results in non-uniform oxidization.

13. The metal-oxide-silicon light emitting device according to claim 1 wherein said silicon-based substrate is of a type selected from the group consisting of: a P-type, N-type, and undoped semiconductor.

14. The metal-oxide-silicon light emitting device according to claim 4 wherein said silicon-based substrate is of a type selected from the group consisting of: a P-type, N-type, and undoped semiconductor.

15. The metal-oxide-silicon light emitting device according to claim 5 wherein said silicon-based substrate is of a type selected from the group consisting of: a P-type, N-type, and undoped semiconductor.

16. The metal-oxide-silicon light emitting device according to claim 1 wherein said metal layer is selected from the group consisting of: silver, aluminum, indium-tin-oxide and a conducting material.

17. The metal-oxide-silicon light emitting device according to claim 4 wherein said metal layer is selected from the group consisting of: silver, aluminum, indium-tin-oxide and a conducting material.

18. The metal-oxide-silicon light emitting device according to claim 5 wherein said metal layer is formed by a material selected from the group consisting of: silver, silver paint, aluminum, indium-tin-oxide and a conducting material.

19. The metal-oxide-silicon light emitting device according to claim 1 wherein said silicon-based substrate includes a material having an indirect bandgap.

20. The metal-oxide-silicon light emitting device according to claim 4 wherein said silicon-based substrate includes a material having an indirect bandgap.

21. The metal-oxide-silicon light emitting device according to claim 5 wherein said silicon-based substrate includes a material having an indirect bandgap.

* * * * *